(12) United States Patent
Hong et al.

(10) Patent No.: US 7,954,041 B2
(45) Date of Patent: May 31, 2011

(54) APPARATUS AND METHOD FOR TRANSMITTING/RECEIVING A SIGNAL IN A COMMUNICATION SYSTEM USING A LOW DENSITY PARITY CHECK CODE

(75) Inventors: Song-Nam Hong, Seoul (KR); Pan-Yuh Joo, Seoul (KR); Jung-Je Son, Seongnam-si (KR); Jae-Weon Cho, Suwon-si (KR); Hyoung-Kyu Lim, Seoul (KR); Yeong-Moon Son, Anyang-si (KR); Sung-Jin Lee, Suwon-si (KR); Mi-Hyun Lee, Seoul (KR); Hyun-Jeong Kang, Seoul (KR); Young-Ho Kim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 1245 days.

(21) Appl. No.: 11/590,102

(22) Filed: Oct. 31, 2006

(65) Prior Publication Data

US 2007/0113147 A1 May 17, 2007

(30) Foreign Application Priority Data

Oct. 31, 2005 (KR) ........................ 10-2005-0103228

(51) Int. Cl.
*H03M 13/03* (2006.01)

(52) U.S. Cl. ...................... 714/790; 714/758; 714/774

(58) Field of Classification Search ................. 714/852, 714/758, 790, 774
See application file for complete search history.

(56) References Cited

U.S. PATENT DOCUMENTS

| 7,260,761 B2 * | 8/2007 | Dottling et al. ............... 714/751 |
| 7,519,895 B2 | 4/2009 | Kyung et al. |
| 2003/0088822 A1 | 5/2003 | Kim et al. |
| 2003/0159100 A1 * | 8/2003 | Buckley et al. ............... 714/758 |
| 2005/0022097 A1 * | 1/2005 | Cheng ........................... 714/774 |
| 2005/0149841 A1 | 7/2005 | Kyung et al. |
| 2006/0031737 A1 * | 2/2006 | Chugg et al. .................. 714/755 |
| 2006/0045197 A1 * | 3/2006 | Ungerboeck et al. ......... 375/261 |
| 2008/0016433 A1 * | 1/2008 | Stolpman ...................... 714/786 |

FOREIGN PATENT DOCUMENTS

| KR | 1020030015799 | 2/2003 |
| KR | 1020050046468 | 5/2005 |
| KR | 1020050046471 | 5/2005 |

OTHER PUBLICATIONS

Dammer et al. A data puncturing IR-scheme for Type-II hybrid ARQ protocols using LDPC codes. May 2004. IEEE Communication Globecom. pp. 3012-3016.*

* cited by examiner

*Primary Examiner* — Sam Rizk
(74) *Attorney, Agent, or Firm* — The Farrell Law Firm, P.C.

(57) ABSTRACT

An apparatus and method are provided for transmitting a signal in a communication system using a low density parity check (LDPC) code. An LDPC codeword is generated by encoding an information word at a coding rate. A puncturing pattern is generated when a hybrid automatic repeat request (HARQ) scheme to be applied to the LDPC codeword is an incremental redundancy (IR) scheme. An additional pattern is generated when the HARQ scheme to be applied to the LDPC codeword is a partial chase combining (CC) scheme. A signal is transmitted by applying the puncturing pattern to the LDPC codeword at an associated coding rate when the HARQ scheme to be used is the IR scheme. A signal is transmitted by applying the additional pattern to the LDPC codeword at an associated coding rate when the HARQ scheme to be used is the partial CC scheme.

48 Claims, 10 Drawing Sheets

APPARATUS AND METHOD FOR TRANSMITTING/RECEIVING A SIGNAL IN A COMMUNICATION SYSTEM USING A LOW DENSITY PARITY CHECK CODE

PRIORITY

This application claims priority under 35 U.S.C. §119 to an application filed in the Korean Intellectual Property Office on Oct. 31, 2005 and assigned Serial No. 2005-103228, the contents of which are incorporated herein by reference.

BACKGROUND OF THE INVENTION

1. Field of the Invention

The present invention generally relates to an apparatus and method for transmitting/receiving a signal in a communication system using a low density parity check (LDPC) code, and more particularly to an apparatus and method for transmitting/receiving a signal according to partial incremental redundancy (IR) scheme in a communication system using an LDPC code.

2. Description of the Related Art

The most fundamental problem in communication is on how efficiently and reliably data can be transmitted over a channel. In the next generation multimedia mobile communication systems, on which extensive research is being conducted, it is mandatory to increase the system efficiency using a proper channel-coding scheme, as the systems are required to process and transmit a large amount of data such as images, wireless data, etc. beyond a basic voice service.

However, when data is transmitted, information loss may result from inevitable error due to noise, interference and fading according to channel condition. To reduce this information loss, various error control schemes are used according to channel characteristics, such that the system reliability is improved. Among the error control schemes, the most basic scheme is an error correction code scheme. The error correction code scheme will be referred to as the forward error correction (FEC) scheme. Typical error correction codes are a turbo code, a low density parity check (LDPC) code, etc.

The error control schemes include an automatic retransmission request (ARQ) scheme as well as the FEC scheme. The ARQ scheme can obtain the relatively high system reliability with a relatively simple structure. The above-described FEC scheme corrects error of received information using a code with error correction capability. The FEC scheme is used when no feedback channel is present to notify a transmitter if a receiver has successfully received information.

Because no feedback channel is present when the FEC scheme is used, uncorrected data may be transferred if an error correction process for information received by the receiver fails, resulting in performance degradation. The ARQ scheme is used to provide the transmitter with a retransmission request for information in which an error has occurred when the receiver detects an error in the received information using a cyclic redundancy check (CRC) code with superior error detection capability.

There has been proposed a hybrid automatic repeat request (HARQ) scheme corresponding to a new error control scheme in which advantages of the ARQ and FEC schemes are combined. The HARQ scheme reduces the number of retransmissions by correcting a relatively frequent error pattern using the FEC scheme. The HARQ scheme is divided into two types, i.e., type I and type II.

FIG. 1 illustrates a signal transmission operation according to a type-I HARQ scheme in a conventional communication system.

The type-I HARQ scheme is referred to as a chase combining (CC) scheme. In the type-I HARQ scheme, a transmitter transmits signals of the same format upon initial transmission and retransmission and a receiver receives, soft combines the initially transmitted and retransmitted signals, and decodes the soft combined signals. In the type-I HARQ scheme, the transmitter transmits a complete codeword in both the initial transmission and the retransmission. The codeword is a channel codeword, for example, an error correction codeword, and is constructed with an information part corresponding to an information bit stream and a parity part corresponding to parity, i.e., a parity bit stream.

The initial transmission is a first transmission and the retransmission is a subsequent transmission including a second transmission.

Referring to FIG. 1, the transmitter transmits signals of the same format upon initial transmission and retransmission when the type-I HARQ scheme is used. When the receiver has not normally received a signal initially transmitted from the transmitter, i.e., the transmitter detects a retransmission request for the initially transmitted signal, the transmitter retransmits a signal of the same format as that of the initially transmitted signal.

When receiving the signal initially transmitted from the transmitter, the receiver decodes the received signal and checks for errors using the cyclic redundancy check (CRC) code check, etc. When an error has occurred in the received signal, the received signal is buffered. Then, the receiver sends an associated signal retransmission request by sending non-acknowledgement (NAK) information indicating that an error has occurred in the signal initially transmitted by the transmitter. The receiver receives a signal retransmitted from the transmitter in response to the retransmission request, soft combines the buffered signal and the retransmitted signal, and decodes the soft combined signals.

When the same signal, i.e., the total codeword, is transmitted in both the initial transmission and retransmission according to type-I HARQ scheme, there is provided only reception gain rather than coding gain according to channel state.

FIG. 2 illustrates a signal transmission operation according to type-II HARQ scheme in the conventional communication system.

The type-II HARQ scheme is referred to as an incremental redundancy (IR) scheme. In the type-II HARQ scheme, a transmitter transmits signals of different formats upon initial transmission and retransmission and a receiver code combines and decodes the initially transmitted and retransmitted signals. Among currently proposed HARQ schemes, the type-II HARQ scheme provides maximal throughput. The initial transmission is a first transmission and the retransmission is a subsequent transmission including a second transmission.

Referring to FIG. 2, the transmitter transmits signals of different formats upon initial transmission and retransmission when the type-II HARQ scheme is used. When the receiver has not normally received a signal initially transmitted from the transmitter, i.e., the transmitter detects a retransmission request for the initially transmitted signal, the transmitter provides the receiver with a signal different from the initially transmitted signal. In this case, the signal initially transmitted from the transmitter is an information part of a pre-generated codeword and a partial parity bit stream within a parity part. The signal retransmitted from the transmitter is a partial parity bit stream of the remaining parity stream excluding the initially transmitted parity bit stream.

When receiving the initially transmitted signal from the transmitter, the receiver decodes the received signal and checks for errors. When an error has occurred in the received signal, the received signal is buffered. Then, the receiver sends an associated signal retransmission request by sending NAK information indicating that an error has occurred in the signal initially transmitted by the transmitter. The receiver receives a signal retransmitted from the transmitter in response to the retransmission request, soft combines the buffered signal and the retransmitted signal, and decodes the soft combined signals.

When the type-II HARQ scheme is used, the receiver obtains coding gain by soft combining the signals initially transmitted and retransmitted from the transmitter and decoding the soft combined signals. When receiving the signal retransmitted by the transmitter in the type-II HARQ scheme, the receiver code combines and decodes the initially transmitted signal, i.e., an information bit stream and a partial parity bit stream, and a new additional parity bit stream, thereby obtaining coding gain because the signals are decoded at a coding rate that is less than that upon initial transmission.

When the type-II HARQ scheme is used, a codeword is a factor significantly affecting its performance. A design of a rate-compatible code for supporting a superior variable coding rate acts as an important factor for increasing the efficiency of the type-II HARQ scheme.

A general LDPC code is defined by the degree of a check node and the degree of a variable node. As a coding rate decreases, the check node degree decreases and the variable node degree increases. An LDPC code structure is limited to performing coding and decoding processes at a high rate in an actual communication system. In the actual communication system, a maximal variable node degree is limited for fast decoding and a minimal check node degree is limited by the structure of a structured LDPC code, for example, a repeat accumulate (RA) type-LDPC (RT-LDPC) code, for fast coding.

The RT-LDPC code can be an RA code, a concatenated zigzag (CZZ) code, an irregular repeat accumulate (IRA) code, an irregular CZZ (ICZZ) code, a block-type LDPC (B-LDPC) code, etc.

FIG. 3 illustrates the Tanner graph of the conventional RT-LDPC code.

As illustrated in FIG. 3, the Tanner graph of an LDPC code structured for fast coding, i.e., an RT-LDPC code, shows a form in which one check node necessarily connects to two parity nodes. Thus, a coding rate capable of being supported in the RT-LDPC code is also limited. For example, assuming that a maximal variable node degree is limited to a value of less than 7, a minimal coding rate capable of being supported in the RT-LDPC code becomes $1/7$. This is a coding rate of a regular LDPC code with a degree of 6 when all information nodes are variable nodes. However, when an irregular LDPC code is generated to improve the performance of the RT-LDPC code, the coding rate exceeds $1/7$. Thus, when the variable node degree is limited to 6, a minimal coding rate capable of being supported in the irregular LDPC code becomes about $1/5 \sim 1/6$.

When the variable node degree is limited to [PLEASE CONFIRM.] less than 7, a minimal coding rate capable of being supported in the irregular LDPC code becomes about $1/5 \sim 1/6$. Thus, the minimal coding rate capable of being supported becomes about $1/5 \sim 1/6$ even when the type-II HARQ scheme is used. However, when a channel state is bad due to fading in the actual communication system, a coding rate of less than about $1/5 \sim 1/6$ may be needed.

When the RT-LDPC code for supporting a coding rate of less than about $1/5 \sim 1/6$ is needed, a partial CC scheme should be used. The partial CC scheme is a scheme for retransmitting only part of an initially transmitted signal rather than a scheme for retransmitting a signal of the same format as that of an initially transmitted signal as in the CC scheme.

It is preferred that a partial IR scheme corresponding to a combination of the IR scheme and the partial CC scheme is used to support coding rates ranging from a high coding rate to a low coding rate using one RT-LDPC code.

FIG. 4 illustrates a signal transmission operation according to partial IR scheme in the conventional communication system.

Referring to FIG. 4, the partial IR scheme uses the IR scheme at coding rates ranging from a maximal coding rate to a minimal coding rate capable of being supported in the communication system and uses the partial CC scheme when a coding rate less than the minimal coding rate needs to be supported.

As described above, because the partial IR scheme also uses the IR scheme, a design of a codeword for supporting a superior variable coding rate acts as an important factor for improving the performance. In particular, a design of a codeword, i.e., an RT-LDPC codeword, for supporting the variable coding rate is very important in the communication system using an RT-LDPC code. Thus, a need exists for a method for efficiently transmitting/receiving an RT-LDPC codeword for supporting a variable coding rate to improve the performance in a communication system using a partial IR scheme.

SUMMARY OF THE INVENTION

It is, therefore, an object of the present invention to provide an apparatus and method that can transmit and receive a signal using a partial incremental redundancy (IR) scheme in a communication system using a low density parity check (LDPC) code.

It is another object of the present invention to provide an apparatus and method that can transmit and receive a signal using a puncturing pattern and a reception pattern for maximizing the reception performance when a partial IR scheme is used in a communication system using an LDPC code.

In accordance with an aspect of the present invention, there is provided an apparatus for transmitting a signal in a communication system using a low density parity check (LDPC) code that includes an LDPC encoder for generating an LDPC codeword by encoding an information word at a coding rate; a controller for generating a puncturing pattern when a hybrid automatic repeat request (HARQ) scheme to be applied to the LDPC codeword is an incremental redundancy (IR) scheme, generating an additional pattern when the HARQ scheme to be applied to the LDPC codeword is a partial chase combining (CC) scheme, and controlling an operation for transmitting a signal by applying the puncturing pattern to the LDPC codeword at an associated coding rate when the HARQ scheme to be used is the IR scheme and an operation for transmitting a signal by applying the additional pattern to the LDPC codeword at an associated coding rate when the HARQ scheme to be used is the partial CC scheme; a transmission bit decision unit for deciding bits to be transmitted in the LDPC codeword under control of the controller; and a transmission processor for transmitting the bits decided by the transmission bit decision unit.

In accordance with another aspect of the present invention, there is provided a method for transmitting a signal in a communication system using a low density parity check (LDPC) code that includes generating an LDPC codeword by encoding an information word at a coding rate, generating a puncturing pattern when a hybrid automatic repeat request (HARQ) scheme to be applied to the LDPC codeword is an incremental redundancy (IR) scheme, generating an additional pattern when the HARQ scheme to be applied to the LDPC codeword is a partial chase combining (CC) scheme, transmitting a signal by applying the puncturing pattern to the LDPC codeword at an associated coding rate when the HARQ scheme to be used is the IR scheme, and transmitting a signal by applying the additional pattern to the LDPC codeword at an associated coding rate when the HARQ scheme to be used is the partial CC scheme.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE PREFERRED EMBODIMENTS

Figure 1:
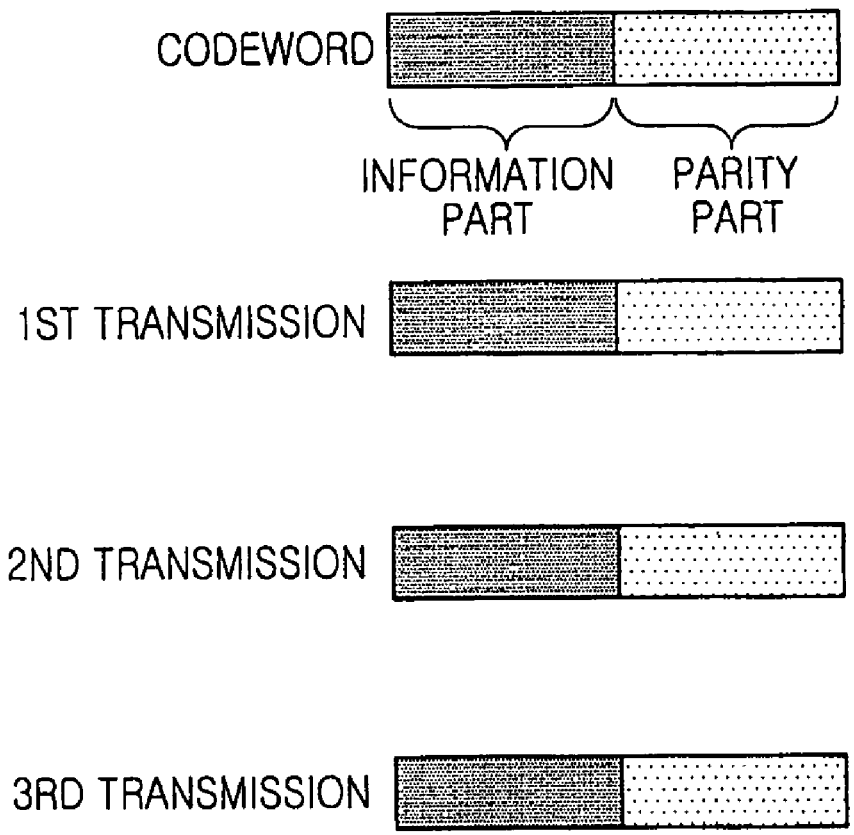
FIG. 1 illustrates a signal transmission operation according to type-I hybrid automatic retransmission request (HARQ) scheme in a conventional communication system.
Figure 2:
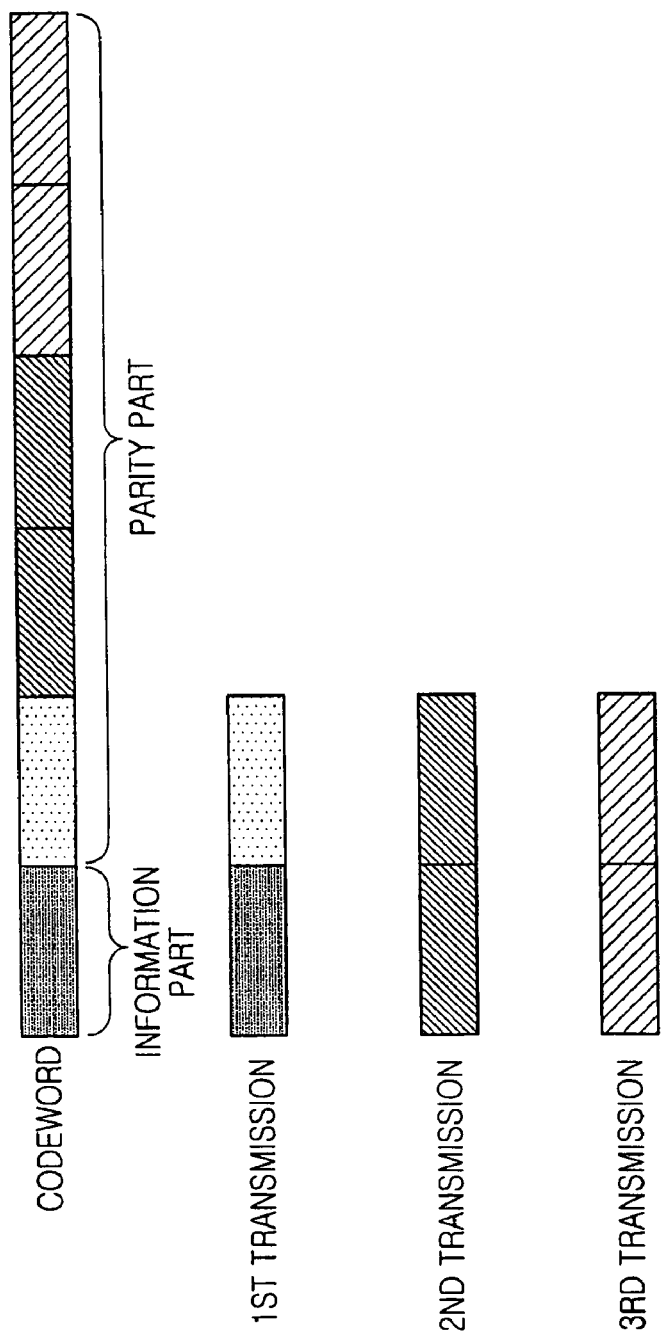
FIG. 2 illustrates a signal transmission operation according to type-II HARQ scheme in the conventional communication system.
Figure 3:
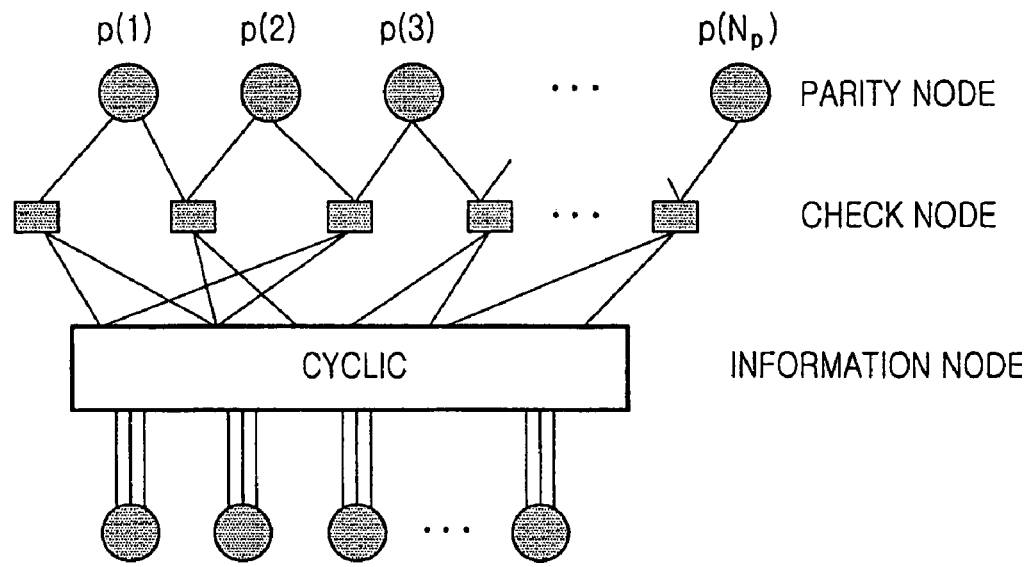
FIG. 3 illustrates a Tanner graph of a conventional repeat accumulate (RA) type-low density parity check (LDPC) (RT-LDPC) code.
Figure 4:
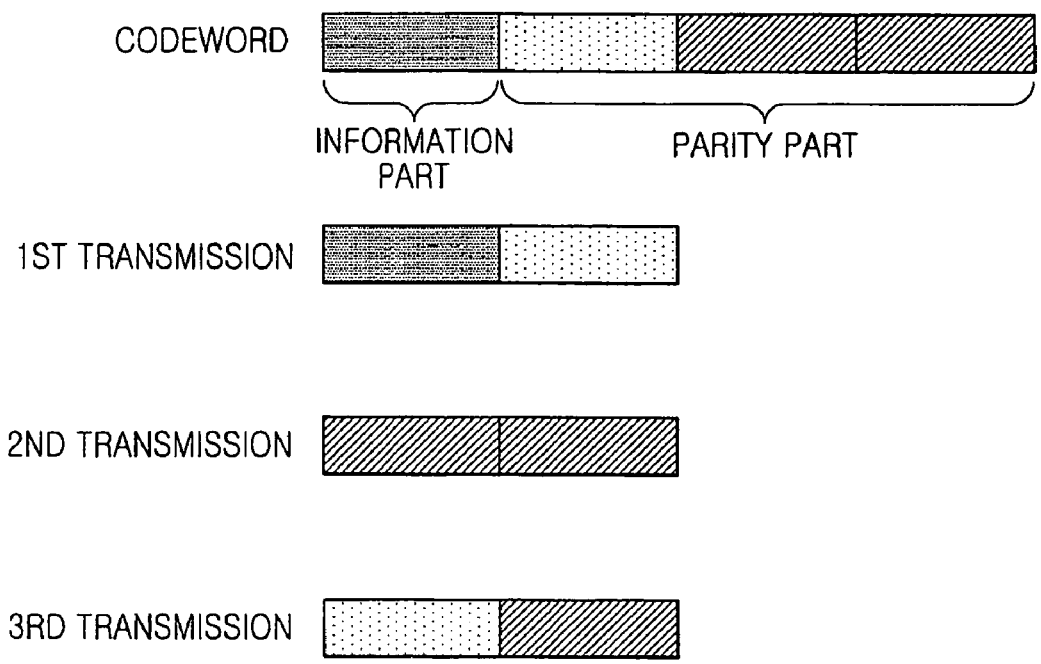
FIG. 4 illustrates a signal transmission operation according to partial incremental redundancy (IR) scheme in the conventional communication system.

Preferred embodiments of the present invention will be described in detail herein below with reference to the accompanying drawings. In the following description, only parts necessary to understand an operation of the present invention are described, and others are omitted for clarity and conciseness.

The present invention provides an apparatus and method for transmitting/receiving a signal in a communication system using a low density parity check (LDPC) code or structured LDPC code, for example, a repeat accumulate (RA) type-LDPC (RT-LDPC) code. The present invention provides an apparatus and method for transmitting/receiving a signal when a partial incremental redundancy (IR) scheme is used as a hybrid automatic repeat request (HARQ) scheme in a communication system using an RT-LDPC code.

In particular, the present invention provides a signal transmission/reception apparatus and method that can improve the reception performance while supporting a variable coding rate by providing a puncturing pattern to be applied to an RT-LDPC codeword when an IR scheme is used and an additional pattern to be applied to the RT-LDPC codeword when a partial chase combining (CC) is used, in order to support an associated coding rate in using the partial IR scheme in a communication system using an RT-LDPC code. In the present invention, an example in which the communication system uses the RT-LDPC code will be described. Of course, the signal transmission/reception apparatus and method are not limited to only the case where the RT-LDPC code is used.

The partial IR scheme is a hybrid automatic repeat request (HARQ) scheme corresponding to a combination of the IR scheme and the partial CC scheme and supports coding rates ranging from a high coding rate to a low coding rate using one codeword. The partial IR scheme uses the IR scheme at coding rates ranging from a maximum coding rate to a minimum coding rate capable of being supported in the communication system and uses the partial CC scheme when a coding rate less than the minimum coding rate needs to be supported. In order to support the partial IR scheme, a coded symbol mapped to an associated coding rate is selected from a generated codeword, i.e., a mother codeword, and the selected coded symbol is transmitted. Since an example of the communication system using an RT-LDPC code is being described herein, the mother codeword is an RT-LDPC codeword.

When the coded symbol mapped to the associated coding rate is selected from the mother codeword, i.e., the RT-LDPC codeword, its reception performance depends on how to select and transmit the coded symbol. When the IR scheme is used to improve the reception performance of a receiver while supporting a variable coding rate, there are proposed a puncturing pattern for selecting parity bits to be punctured at the associated coding rate in the RT-LDPC codeword when the IR scheme is used and an additional pattern for selecting parity bits to be additionally transmitted at the associated coding rate in the RT-LDPC codeword.

The RT-LDPC codeword includes an information part corresponding to an information word, i.e., an information bit stream, and a parity part corresponding to parity, i.e., a parity bit stream. When the IR scheme is used, the transmitter punctures and transmits parity bits within the parity part at the associated coding rate in the RT-LDPC codeword. An operation for puncturing the parity bits is the same as an operation for sequentially transmitting permuted parity bits at the associated coding rate after permutation of all parity bits within the parity part in the puncturing pattern. It should be noted that the puncturing pattern proposed in the present invention is a permutation pattern, having the same effect as the actual puncturing operation, rather than a pattern for puncturing the parity bits. When the partial CC scheme is used, the transmitter selects parity bits within the parity part from the RT-LDPC codeword at the associated coding rate and additionally transmits the selected parity bits. In this case, after all parity bits within the parity part are permuted in the additional pattern, the permuted parity bits are sequentially transmitted at the associated coding rate.

The puncturing pattern and the additional pattern provides in the present invention are used for grouping parity bits within the parity part in a unit of a number of bits and permuting the generated groups. Parity bits to be applied to the puncturing pattern and the additional pattern are permuted in a group unit.

Figure 5:
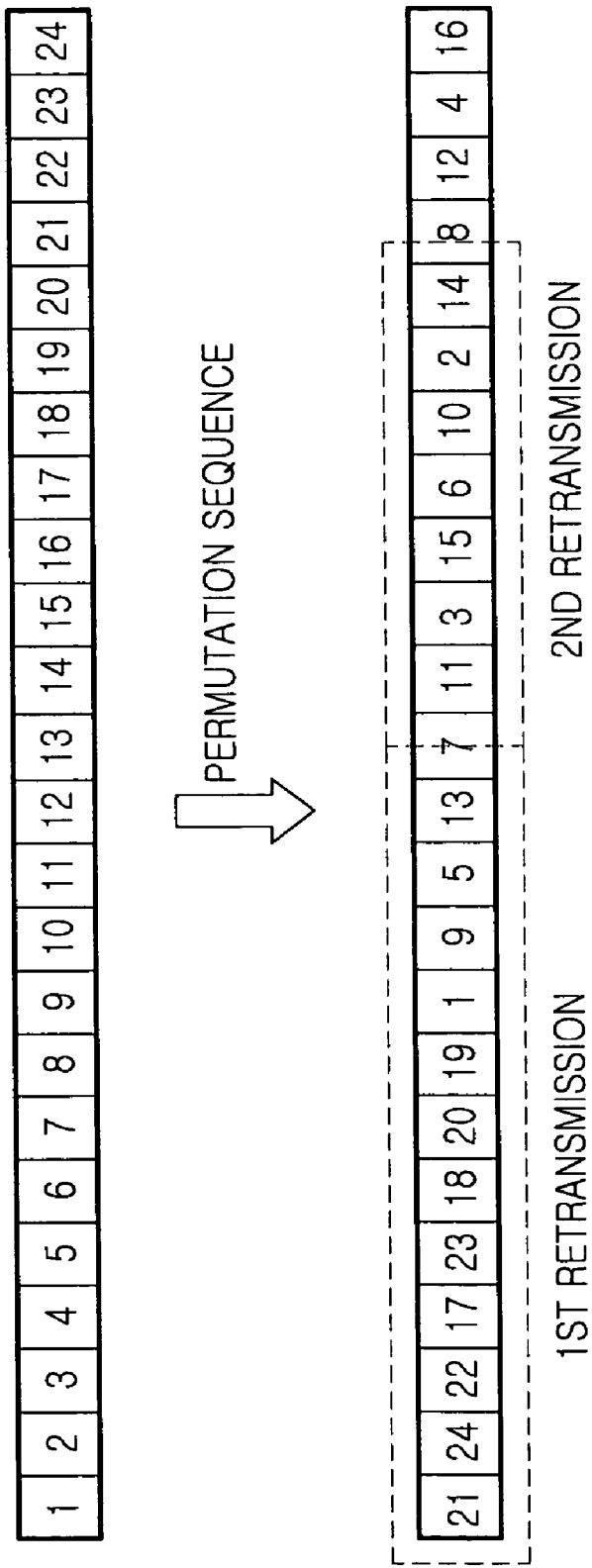
FIG. 5 illustrates a parity-bit permutation operation when a puncturing pattern is applied in a communication system using an RT-LDPC code in accordance with the present invention.

FIG. 5 illustrates a parity-bit permutation operation when the puncturing pattern is applied in the communication system using an RT-LDPC code in accordance with the present invention.

When an information word to be transmitted is generated and encoded in the communication system, a mother codeword, i.e., an RT-LDPC codeword, is generated. As described above, the RT-LDPC codeword includes an information part corresponding to the information codeword and a parity part corresponding to parity. In FIG. 5, only the parity part of the RT-LDPC codeword is illustrated. Parity bits of the parity part are constructed with a total of 24 groups. Herein, each of the groups includes a total of L parity bits. When the IR scheme is used in the partial IR scheme, the groups are permuted according to the puncturing pattern and the parity bits are sequentially transmitted at an associated coding rate. When the partial CC scheme is used, the groups are permuted according to an additional pattern and the parity bits are sequentially transmitted at an associated coding rate.

In FIG. 5, a group permutation operation is illustrated when the puncturing pattern is applied. As illustrated in FIG. 5, the parity bits are sequentially transmitted at the time of an initial transmission, i.e., a first transmission, and a retransmission, i.e., a second transmission. Of course, information bits as well as the parity bits are transmitted upon initial transmission. The initial transmission is the first transmission and the retransmission is a subsequent transmission including the second transmission. Although not illustrated, the group permutation operation in the case where the additional pattern is applied is the same as that in the case where the puncturing pattern is applied.

The puncturing pattern and the additional pattern are generated which can satisfy the following design criterion. The design criterion is generated by a density evolution scheme. Since the density evolution scheme itself is not directly related to the present invention, a detailed description is omitted.

Design Criterion

The puncturing pattern and the additional pattern are generated such that a message to be transferred from a check node to an information node has a uniform value, if possible.

The puncturing pattern and the additional pattern satisfying the design criterion are detected in the density evolution scheme. This differs according to structure of the RT-LDPC code.

Figure 6:
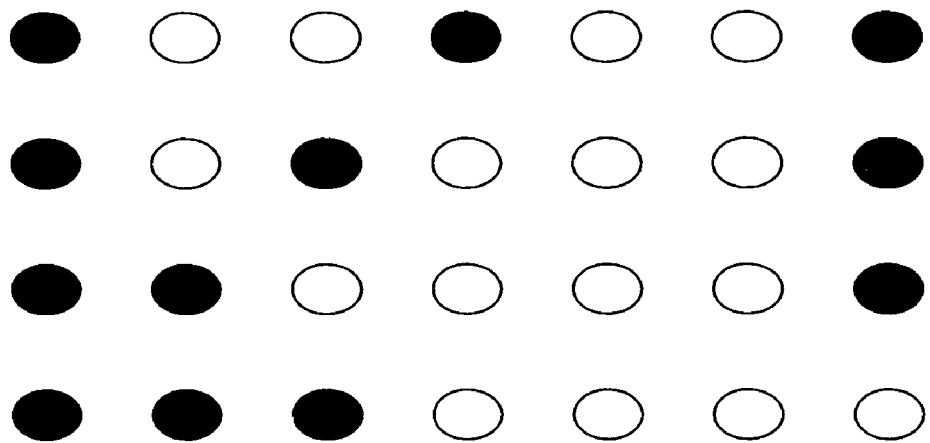
FIG. 6 illustrates an operation for generating a puncturing pattern that satisfies a design criterion in accordance with the present invention.

FIG. 6 illustrates the operation for generating the puncturing pattern that satisfies the design criterion in accordance with the present invention.

To satisfy the design criterion, the puncturing pattern should be set such that parity bits are arranged at regular distances if possible before the RT-LDPC codeword is punctured. Referring to FIG. 6, black circles are unpunctured parity bits in the RT-LDPC codeword and white circles are punctured parity bits in the RT-LDPC codeword.

As illustrated in FIG. 6, the unpunctured parity bits in the RT-LDPC codeword are arranged at maximally regular intervals in a pattern of the top line. Thus, when the performance is analyzed through the actual simulation and density evolution scheme, the pattern of the top line among four patterns as illustrated in FIG. 6 exhibits the best performance. From FIG. 6, it can be seen that the performance is degraded as the line goes down. This shows that the performance is superior when the unpunctured parity bits of the RT-LDPC codeword are arranged at regular distances, if possible, as described with reference to the design criterion.

Figure 7:
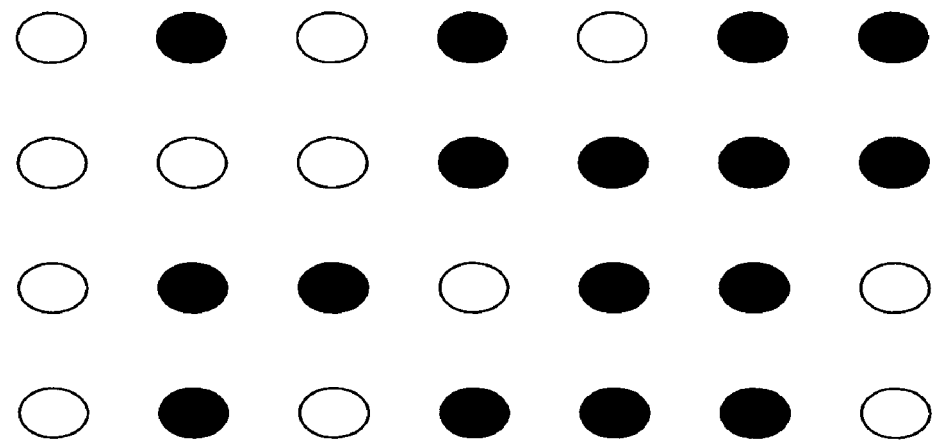
FIG. 7 illustrates an operation for generating an additional pattern that satisfies a design criterion in accordance with the present invention.

FIG. 7 illustrates the operation for generating the additional pattern that satisfies the design criterion in accordance with the present invention.

Referring to FIG. 7, black circles are parity bits transmitted in the RT-LDPC codeword once and white circles are parity bits transmitted in the RT-LDPC codeword twice. When the performance is analyzed through the actual simulation and density evolution scheme, the pattern of the top line among four patterns as illustrated in FIG. 7 exhibits the best performance. The puncturing pattern has the best performance when unpunctured parity bits are arranged at regular intervals. The additional pattern is set in which parity bits to be additionally transmitted are alternately arranged, which is different from the puncturing pattern. When the parity bits to be additionally transmitted are no longer alternately arranged, they are arranged in empty positions from the beginning. In FIG. 7, an additional pattern placed on the first line outperforms that placed on the third line.

Figure 8:
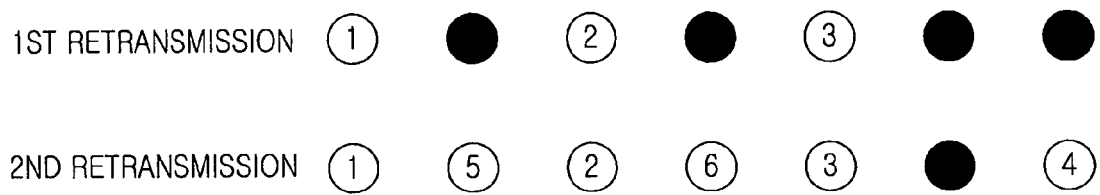
FIG. 8 illustrates an operation for retransmitting a signal according to additional pattern when the partial IR scheme is used in the communication system using an RT-LDPC code in accordance with a the present invention.

FIG. 8 illustrates the signal retransmission operation according to additional pattern when the partial IR scheme is used in the communication system using an RT-LDPC code in accordance with the present invention.

It is assumed that the number of parity bits of an RT-LDPC codeword is 7 and three parity bits are transmitted upon retransmission. As illustrated in FIG. 8, parity bits to be additionally transmitted are alternately arranged in a first retransmission. Because the parity bits to be additionally transmitted are no longer alternately arranged in a second retransmission, they are arranged in empty positions from the beginning. When the number of parity bits of the RT-LDPC codeword exceeds 7, the additional pattern should be set as described with reference to FIG. 8.

Figure 9:
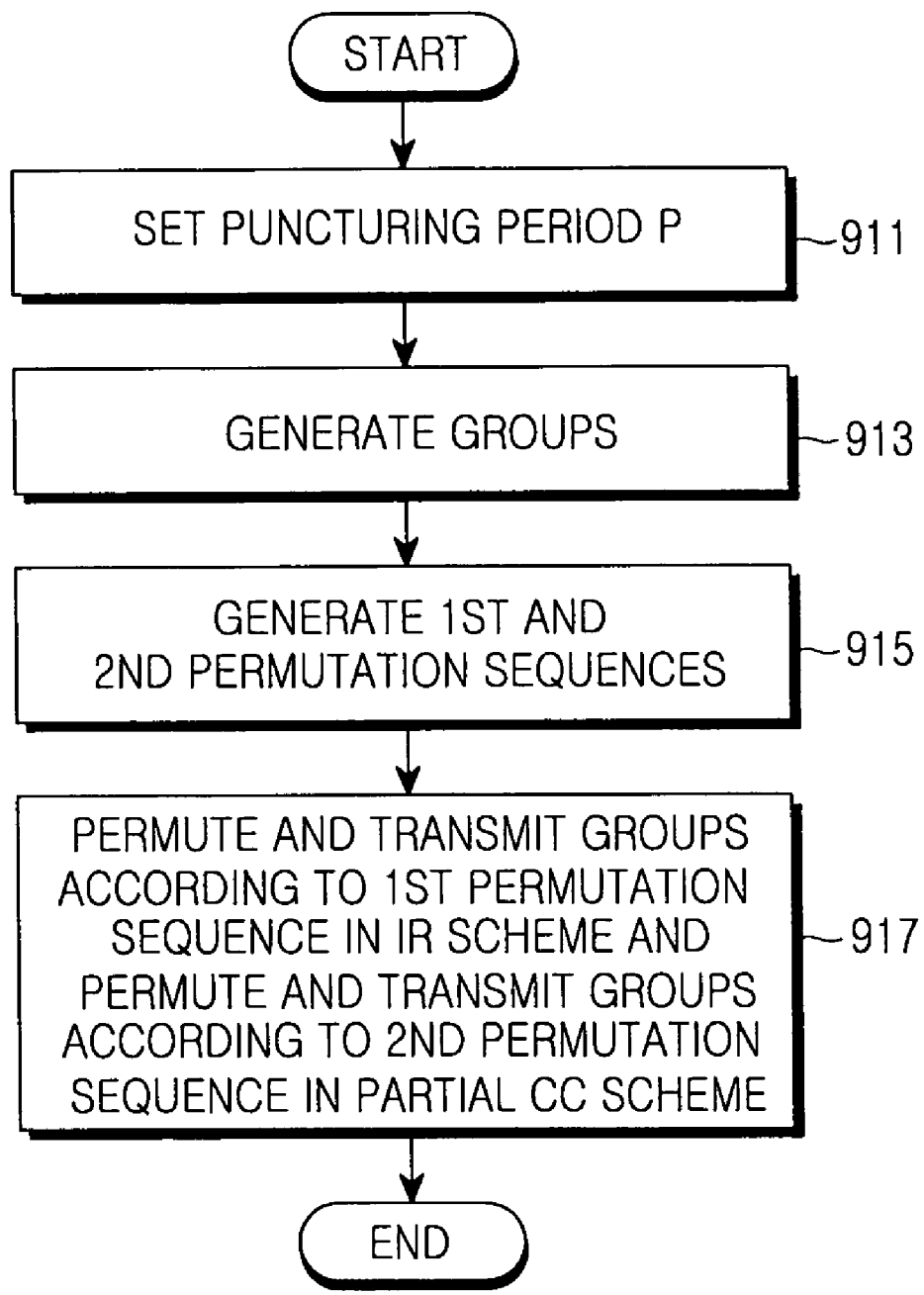
FIG. 9 is a flowchart illustrating a signal transmission operation for supporting the partial IR scheme using the puncturing pattern and the additional pattern in the communication system using an RT-LDPC code in accordance with the present invention.

FIG. 9 is a flowchart illustrating the signal transmission operation for supporting the partial IR scheme using the puncturing pattern and the additional pattern in the communication system using an RT-LDPC code in accordance with the present invention.

It is assumed that a coding rate of an RT-LDPC codeword corresponding to a generated codeword, i.e., a mother codeword, is $$R_m = \frac{N}{(N + P_m)}$$

and a maximal coding rate capable of being supported in the communication system is $$R_t = \frac{N}{(N + P_t)}.$$

N is the number of information bits, $P_m$ is the number of parity bits satisfying the coding rate $R_m$, and $P_t$ is the number of parity bits satisfying the coding rate $R_t$. To support the maximal coding rate $R_t$, the number of parity bits to be punctured in the RT-LDPC codeword becomes ($P_m$–$P_t$).

Referring to FIG. 9, a controller (not illustrated) sets a puncturing pattern period P for supporting the maximal coding rate $R_t$ in step 911 and then proceeds to step 913. The puncturing pattern period P is computed by Equation (1).

$$x = \frac{P_m}{P_t} \tag{1}$$

In Equation (1), the puncturing pattern period P is x·b (P=x·b) and b is a minimal value when x·b is an integer.

The controller generates $$\frac{P_m}{P}$$

groups G(i) by grouping the $P_m$ parity bits in a unit of P bits in step 913 and then proceeds to step 915. In step 915, the controller generates a first permutation sequence PS1 mapped to a puncturing pattern for permuting the $$\frac{P_m}{P}$$

groups G(i) in order to satisfy the design criterion. Further, the controller generates a second permutation sequence PS2 mapped to an additional pattern for permuting the $$\frac{P_m}{P}$$

groups G(i) in order to satisfy the design criterion and then proceeds to step 917. As described above, when the IR scheme is used in the partial IR scheme, i.e., the number of retransmissions is small, the groups G(i) are permuted according to first permutation sequence PS1. When the partial CC scheme is used, i.e., the number of retransmissions is large, the groups G(i) are permuted and re-arranged according to second permutation sequence PS2.

In step 917, the controller controls an operation for permuting the groups G(i) in the first or second permutation sequence PS1 or PS2 according to whether the IR scheme or the partial CC scheme is to be used in the partial IR scheme. If the IR scheme is to be used, the controller controls an operation for transmitting groups permuted in the first permutation sequence PS1 at an associated coding rate. If the partial CC scheme is to be used, the controller controls an operation for transmitting groups permuted in the second permutation sequence PS2 at an associated coding rate. When the IR scheme is used, the controller transmits an information part as well as the groups permuted in the first permutation sequence PS1 upon initial transmission.

The Institute of Electrical and Electronics Engineers (IEEE) 802.16e standard defines a communication system set to transmit and receive a signal using a block-LDPC (B-LDPC) code corresponding to a type of RT-LDPC code.

An operation for generating a puncturing pattern and an additional pattern that satisfy the design criterion will be described when the B-LDPC code is used.

An operation for generating the first permutation sequence and the second permutation sequence will be described.

Basic parameters of the B-LDPC code are defined as follows.

(1) Size of a base matrix: M×N
(2) Sizes of a permutation matrix and a zero matrix: L×L The permutation matrix is an L×L square matrix. In the permutation matrix, L rows have a weight of 1, respectively, and also L columns have a weight of 1, respectively.

Thus, a size of a parity check matrix of the B-LDPC code is LM×LN. The parity check matrix can be generated by extending the base matrix with the L×L permutation or zero matrix. That is, the parity check matrix is generated by substituting the zero matrix into elements with a value of –1 in the base matrix and substituting the permutation matrix into an element with a positive integer. The positive integer is a start value of the permutation matrix. For example, when L=3 and the positive integer is 2, the permutation matrix as shown in Equation (2) is substituted into the base matrix.

$$\begin{bmatrix} 0 & 0 & 1 \\ 1 & 0 & 0 \\ 0 & 1 & 0 \end{bmatrix} \tag{2}$$

As described above, a codeword mapped to a B-LDPC code of the LM×LN parity check matrix includes L(N−M) information bits and LM parity bits. In this case, the puncturing pattern period P should be set. It is assumed that the puncturing pattern period P is M.

Then, a total of N groups G(1), G(2), . . . , G(N) are generated by grouping bits in a unit of L bits in the LN-bit codeword. Further, a first permutation sequence and a second permutation sequence should be generated. When the first and second permutation sequences are generated, the design criterion should be satisfied. A method for generating the first and second permutation sequences is as follows.

(1) An element value of the first permutation sequence PS1 to be applied to a first parity group is set to 1. The parity group is a group including parity bits rather than information bits among the N groups.

PS1(1)=1 and PS2(1)=1

(2) Element values of the first and second permutation sequences PS1 and PS2 to be applied to groups, i.e., (M−1) parity groups, excluding the first parity group are set to satisfy the design criterion.

As described above, when the B-LDPC code is used, the puncturing pattern and the additional pattern, i.e., the first and second permutation sequences PS1 and PS2, are generated according to coding rate and base matrix size.

(1) When the coding rate=⅓, M=16, and N=24,
PS1: 1, 9, 5, 13, 3, 7, 11, 15, 2, 10, 6, 14, 4, 12, 8, 16
PS2: 1, 3, 5, 7, 9, 11, 13, 15, 2, 4, 6, 8, 10, 12, 14, 16
(2) When the coding rate=⅕, M=16, and N=20,
PS1: 1, 9, 5, 13, 3, 7, 11, 15, 2, 10, 6, 14, 4, 12, 8, 16
PS2: 1, 3, 5, 7, 9, 11, 13, 15, 2, 4, 6, 8, 10, 12, 14, 16

When the B-LDPC code is used, a transmission signal sequence for supporting the partial IR scheme is as follows. A sequential transmission is performed at an associated coding rate. The transmission signal sequence will be described with reference to an example in which the coding rate=⅓, M=16, and N=24.

Transmission Signal Sequence

A transmission is performed in order of an information bit stream, a parity bit stream mapped to parity group indices 1, 9, 5, 13, 3, 7, 11, 15, 2, 10, 6, 14, 4, 12, 8, 16, a parity bit stream mapped to parity group indices 1, 3, 5, 7, 9, 11, 13, 15, 2, 4, 6, 8, 10, 12, 14, 16, an information bit stream, . . . , a parity bit stream mapped to parity group indices 1, 3, 5, 7, 9, 11, 13, 15, 2, 4, 6, 8, 10, 12, 14, 16, and an information bit stream.

Figure 10:
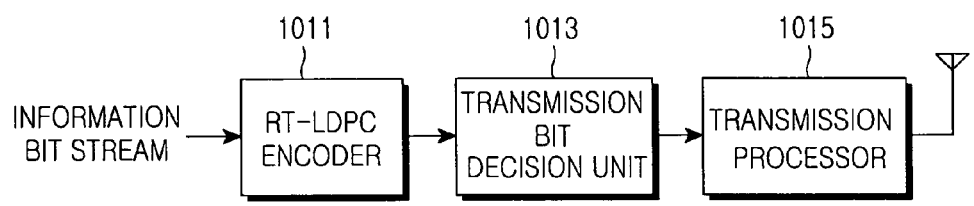
FIG. 10 illustrates a structure of a transmitter in the communication system using an RT-LDPC code in accordance with the present invention.

FIG. 10 illustrates the structure of the transmitter in the communication system using an RT-LDPC code in accordance with the present invention.

Referring to FIG. 10, the transmitter includes an RT-LDPC encoder 1011, a transmission bit decision unit 1013, and a transmission processor 1015.

When an information bit stream to be transmitted is generated, it is input to the RT-LDPC encoder 1011. The RT-LDPC encoder 1011 encodes the input information bit stream, generates an RT-LDPC codeword, and outputs the generated RT-LDPC codeword to the transmission bit decision unit 1013. The transmission bit decision unit 1013 receives the RT-LDPC codeword output from the RT-LDPC encoder 1011, decides bits to be transmitted under control of a controller (not illustrated), and outputs the decided bits to be transmitted to the transmission processor 1015. An operation for deciding bits to be transmitted in the RT-LDPC codeword in the transmission bit decision unit 1013 is controlled by the controller as described with reference to FIG. 9.

The transmission processor 1015 performs a transmission process for the bits output from the transmission bit decision unit 1013 through, for example, a radio frequency (RF) processing operation, and transmits the processed bits through an antenna.

As described with reference to FIG. 10, the transmitter of the communication system using the RT-LDPC code stores only the first and second permutation sequences to support the partial IR scheme. Therefore, the partial IR scheme can be easily supported without additionally increasing the complexity.

Figure 11:
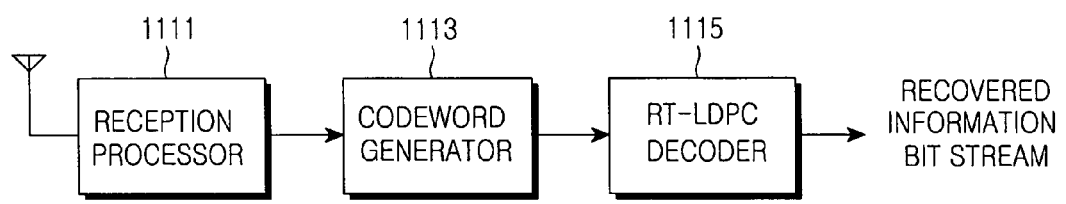
FIG. 11 illustrates a structure of a receiver in the communication system using an RT-LDPC code in accordance with the present invention.

FIG. 11 illustrates the structure of the receiver in the communication system using an RT-LDPC code in accordance with the present invention.

Referring to FIG. 11, the receiver includes a reception processor 1111, a codeword generator 1113, and an RT-LDPC decoder 1115.

When a signal is received through an antenna of the receiver, the received signal is input to the reception processor 1111. The reception processor 1111 performs a reception process for the received signal through, for example, an RF processing operation, and then outputs the processed signal to the codeword generator 1113. The codeword generator 1113 receives a signal output from the reception processor 1111, determines if a current transmission time is the time at which the IR or partial CC scheme is used, considers a position of the last bit previously transmitted, a first permutation sequence, and a second permutation sequence, generates a codeword at the current time, and outputs the generated codeword to the RT-LDPC decoder 1115. The RT-LDPC decoder 1115 receives and decodes a signal output from the codeword generator 1113, thereby recovering and outputting an information bit stream.

The receiver receives at least two signals from transmitted data to which the partial CC scheme is applied in the transmitter, i.e., transmitted data including information bits and parity bits. For example, the data transmitted from the transmitter is denoted by d and the received signals mapped to the transmitted data d are denoted by $r_1$ and $r_2$. A method for recovering an information bit stream using the received signals $r_1$ and $r_2$ when the partial CC scheme is used is different from that for recovering an information bit stream using the CC scheme.

When the CC scheme is used, a value of $$\frac{r_1 + r_2}{2}$$

is input as an initial message value related to the transmitted data d. When the partial CC scheme is used, $r_1$ and $r_2$ are input as initial message values related to the transmitted data d. When data is transmitted using the partial CC scheme, the number of initial values is two. When data is transmitted without use of the partial CC scheme, the number of initial values is one. When a decoding process is performed using a sum-product algorithm, each element of the transmitted data d with two initial values is recognized and processed as one bridge connected to a variable node. Thus, an initial message value of the transmitted data d becomes $(r_1+r_2)$ and is not divided by 2, which is different from an initial message value in the case where the CC scheme is used.

As described with reference to FIG. 11, the receiver of the communication system using an RT-LDPC code stores only the first and second permutation sequences to support the partial IR scheme. Therefore, the partial IR scheme can be easily supported without additionally increasing the complexity.

Figure 12:
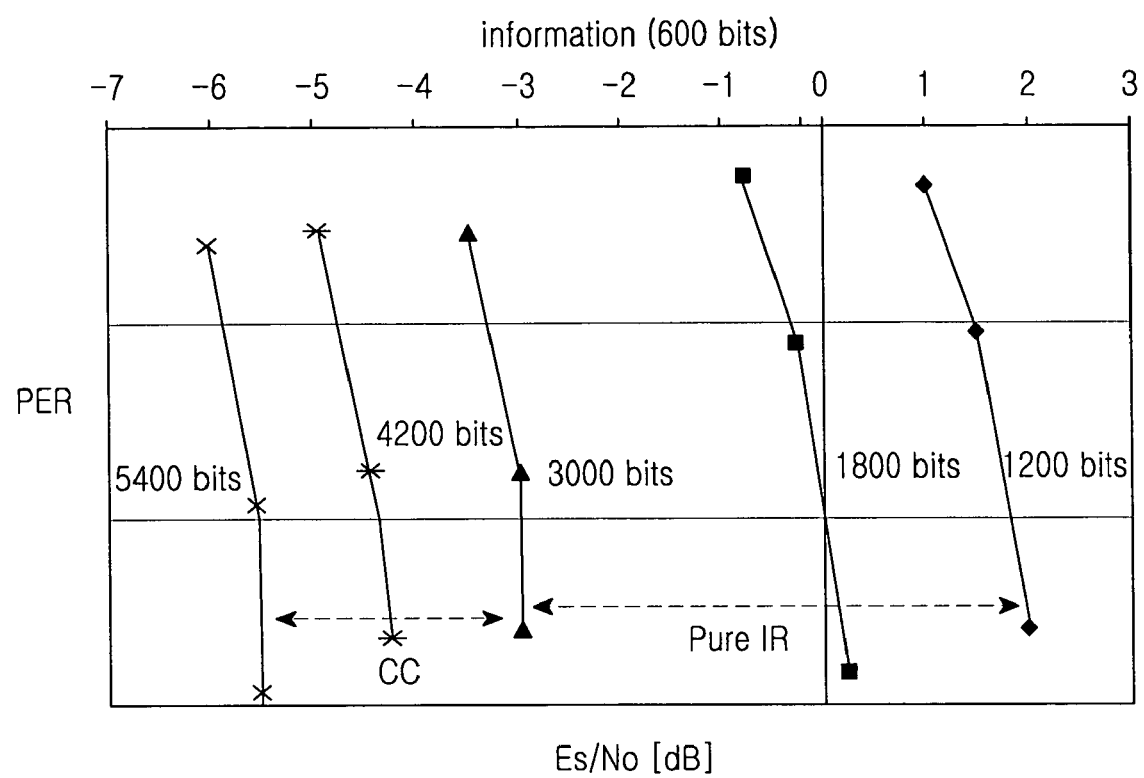
FIG. 12 is a performance graph in the case where the partial IR scheme is used in the communication system using an RT-LDPC code in accordance with the present invention.

FIG. 12 is a performance graph in the case where the partial IR scheme is used in the communication system using an RT-LDPC code in accordance with the present invention.

As illustrated in FIG. 12, the graph is the performance graph in the case where the length of an information word is 600 and a coding rate of an RT-LDPC codeword corresponding to a mother codeword is 1/5. A graph indicated by 1200 bits indicates the performance of a first transmission and indicates the performance when an information word with the length of 600 and parity with the length of 600 are transmitted and a decoding process is performed by an LDPC code at a coding rate of 1/2. A graph indicated by 1800 bits indicates the performance of a second transmission and indicates the performance when parity with the length of 600 is transmitted and a decoding process is performed by an LDPC code at a coding rate of 1/3 while combining bits of the first transmission with bits of the second transmission. A graph indicated by 3000 bits indicates the performance of a third transmission and indicates the performance when parity with the length of 1200 is transmitted and a decoding process is performed by an LDPC code at a coding rate of 1/5 while combining bits of the first and second transmissions with bits of the third transmission. The IR scheme is applied to the first to third transmissions.

A graph indicated by 4200 bits indicates the performance of a fourth transmission. From this graph, it can be seen that 1200 bits of the already transmitted bits are additionally transmitted and the partial CC scheme is applied to an LDPC code at the coding rate of 1/5. A graph indicated by 5400 bits indicates the performance of a fifth transmission. Among the already transmitted bits, 1200 bits are additionally transmitted. A coding rate of an LDPC code to be used upon decoding is 1/5.

When a signal provided in the present invention is transmitted and received as described with reference to FIG. 12, a wide range of a signal to noise ratio (SNR) can be supported using one LDPC code.

As is apparent from the above description, the present invention provides a puncturing pattern and an additional pattern for supporting a variable coding rate in a communication system using an RT-LDPC code, thereby maximizing the reception performance in supporting a partial IR scheme.

Although the exemplary embodiments of the present invention have been disclosed for illustrative purposes, those skilled in the art will appreciate that various modifications, additions, and substitutions are possible, without departing from the scope of the present invention. Therefore, the present invention is not limited to the above-described embodiments, but is defined by the following claims, along with their full scope of equivalents.

What is claimed is:

1. A method for transmitting a signal in a communication system using a low density parity check (LDPC) code, the method comprising:
   generating an LDPC codeword by encoding at a coding rate an information word;
   generating a puncturing pattern when a hybrid automatic repeat request (HARQ) scheme to be applied to the LDPC codeword is an incremental redundancy (IR) scheme and generating an additional pattern when the HARQ scheme to be applied to the LDPC codeword is a partial chase combining (CC) scheme;
   transmitting a signal by applying the puncturing pattern to the LDPC codeword at an associated coding rate when the HARQ scheme to be used is the IR scheme; and
   transmitting a signal by applying the additional pattern to the LDPC codeword at an associated coding rate when the HARQ scheme to be used is the partial CC scheme, wherein when the LDPC code is a block-LDPC (B-LDPC) code, a size of a base matrix is M×N, sizes of a permutation matrix and a zero matrix are L×L, a size of a parity check matrix is LM×LN, and a B-LDPC codeword comprises L(N−M) information bits and LM parity bits, generating the puncturing pattern comprises:
   generating a total of M groups by grouping parity bits included in the B-LDPC codeword in a unit of L bits;
   setting to 1 an element value of the puncturing pattern to be applied to a first group of the M groups; and
   generating the puncturing pattern such that a message to be transferred from a check node of the B-LDPC codeword to an information node has a uniform value when the M groups are permuted in relation to an element value of the puncturing pattern to be applied to (M−1) parity groups excluding the first parity group of the M groups.

2. The method of claim 1, wherein generating the puncturing pattern comprises:
   generating the puncturing pattern such that a message to be transferred from a check node of the LDPC codeword to an information node has a uniform value when multiple groups generated by grouping parity bits in a unit of a preset number of bits are permuted.

3. The method of claim 2, wherein transmitting the signal by applying the puncturing pattern to the LDPC codeword comprises:
   permuting the multiple groups according to the puncturing pattern; and
   sequentially transmitting either information bits and parity bits or the parity bits at the associated coding rate after permuting the multiple groups.

4. The method of claim 1, wherein generating the additional pattern comprises:
   generating the additional pattern such that a message to be transferred from a check node of the LDPC codeword to an information node has a uniform value when multiple groups generated by grouping parity bits in a unit of a preset number of bits are permuted.

5. The method of claim 4, wherein transmitting the signal by applying the additional pattern to the LDPC codeword comprises:
   permuting the multiple groups according to the additional pattern; and
   sequentially transmitting either information bits and parity bits or the parity bits at the associated coding rate after permuting the multiple groups.

6. The method of claim 1, wherein transmitting the signal by applying the puncturing pattern to the LDPC codeword comprises:
   permuting the groups according to the puncturing pattern; and
   sequentially transmitting either information bits and parity bits or the parity bits at the associated coding rate after permuting the groups.

7. The method of claim 1, wherein when the associated coding rate is 1/3, M is 16, and N is 24, the puncturing pattern (PS1) is defined by parity group indices 1, 9, 5, 13, 3, 7, 11, 15, 2, 10, 6, 14, 4, 12, 8, 16.

8. The method of claim 1, wherein when the associated coding rate is 1/5, M is 16, and N is 20, the puncturing pattern (PS1) is defined by parity group indices 1, 9, 5, 13, 3, 7, 11, 15, 2, 10, 6, 14, 4, 12, 8, 16.

9. The method of claim 1, wherein when the LDPC code is a block-LDPC (B-LDPC) code, a size of a base matrix is M×N, sizes of a permutation matrix and a zero matrix are L×L, a size of a parity check matrix is LM×LN, and a B-LDPC codeword comprises L(N−M) information bits and LM parity bits, generating the additional pattern comprises:
   generating a total of M groups by grouping parity bits included in the B-LDPC codeword in a unit of L bits;
   setting to 1 an element value of the additional pattern to be applied to a first group of the M groups; and
   generating the additional pattern such that a message to be transferred from a check node of the B-LDPC codeword to an information node has a uniform value when the M groups are permuted in relation to an element value of the additional pattern to be applied to (M−1) parity groups excluding the first parity group of the M groups.

10. The method of claim 9, wherein transmitting the signal by applying the additional pattern to the LDPC codeword comprises:
    permuting the groups according to the additional pattern; and
    sequentially transmitting either information bits and parity bits or the parity bits at the associated coding rate after permuting the groups.

11. The method of claim 9, wherein when the associated coding rate is 1/3, M is 16, and N is 24, the additional pattern (PS2) is defined by parity group indices 1, 3, 5, 7, 9, 11, 13, 15, 2, 4, 6, 8, 10, 12, 14, 16.

12. The method of claim 9, wherein when the associated coding rate is 1/5, M is 16, and N is 20, the puncturing pattern (PS1) is defined by parity group indices 1, 3, 5, 7, 9, 11, 13, 15, 2, 4, 6, 8, 10, 12, 14, 16.

13. A method for transmitting a signal in a communication system using a low density parity check (LDPC) code, the method comprising:
    generating an LDPC codeword by encoding at a coding rate an information word;
    generating a puncturing pattern when a hybrid automatic repeat request (HARQ) scheme to be applied to the LDPC codeword is an incremental redundancy (IR) scheme and generating an additional pattern when the HARQ scheme to be applied to the LDPC codeword is a partial chase combining (CC) scheme;

transmitting a signal by applying the puncturing pattern to the LDPC codeword at an associated coding rate when the HARQ scheme to be used is the IR scheme; and transmitting a signal by applying the additional pattern to the LDPC codeword at an associated coding rate when the HARQ scheme to be used is the partial CC scheme, wherein when the LDPC code is a block-LDPC (B-LDPC) code, a size of a base matrix is M×N, sizes of a permutation matrix and a zero matrix are L×L, a size of a parity check matrix is LM×LN, and a B-LDPC codeword comprises L(N−M) information bits and LM parity bits, generating the puncturing pattern comprises:

generating a total of M groups by grouping parity bits included in the B-LDPC codeword in a unit of L bits;

setting to 1 an element value of the puncturing pattern to be applied to a first group of the M groups; and generating the puncturing pattern such that parity bits before the B-LDPC codeword is punctured are arranged at regular distances when the M groups are permuted in relation to an element value of the puncturing pattern to be applied to (M−1) parity groups excluding the first parity group of the M groups.

14. The method of claim 13, wherein generating the puncturing pattern comprises:

generating the puncturing pattern such that parity bits are arranged at regular distances before the LDPC codeword is punctured when multiple groups generated by grouping parity bits in a unit of a preset number of bits are permuted.

15. The method of claim 14, wherein transmitting the signal by applying the puncturing pattern to the LDPC codeword comprises:

permuting the multiple groups according to the puncturing pattern; and sequentially transmitting either information bits and parity bits or the parity bits at the associated coding rate after permuting the multiple groups.

16. The method of claim 13, wherein generating the additional pattern comprises:

when multiple groups generated by grouping parity bits in a unit of a preset number of bits are permuted, generating the additional pattern such that additional parity bits to be transmitted are alternately arranged and the additional parity bits are arranged in empty positions from a beginning if the additional parity bits can no longer be alternately arranged.

17. The method of claim 16, wherein transmitting the signal by applying the additional pattern to the LDPC codeword comprises:

permuting the multiple groups according to the additional pattern; and sequentially transmitting either information bits and parity bits or the parity bits at the associated coding rate after permuting the multiple groups.

18. The method of claim 13, wherein transmitting the signal by applying the puncturing pattern to the LDPC codeword comprises:

permuting the groups according to the puncturing pattern; and sequentially transmitting either information bits and parity bits or the parity bits at the associated coding rate after permuting the groups.

19. The method of claim 13, wherein when the associated coding rate is 1/3, M is 16, and N is 24, the puncturing pattern (PS1) is defined by parity group indices 1, 9, 5, 13, 3, 7, 11, 15, 2, 10, 6, 14, 4, 12, 8, 16.

20. The method of claim 13, wherein when the associated coding rate is 1/5, M is 16, and N is 20, the puncturing pattern (PS1) is defined by parity group indices 1, 9, 5, 13, 3, 7, 11, 15, 2, 10, 6, 14, 4, 12, 8, 16.

21. The method of claim 13, wherein when the LDPC code is a block-LDPC (B-LDPC) code, a size of a base matrix is M×N, sizes of a permutation matrix and a zero matrix are L×L, a size of a parity check matrix is LM×LN, and a B-LDPC codeword comprises L(N−M) information bits and LM parity bits, generating the additional pattern comprises:

generating a total of M groups by grouping parity bits included in the B-LDPC codeword in a unit of L bits;

setting to 1 an element value of the puncturing pattern to be applied to a first group of the M groups; and when the M groups are permuted in relation to an element value of the puncturing pattern to be applied to (M−1) parity groups excluding the first parity group of the M groups, generating the additional pattern such that additional parity bits to be transmitted are alternately arranged and the additional parity bits are arranged in empty positions from a beginning if the additional parity bits can no longer be alternately arranged.

22. The method of claim 21, wherein transmitting the signal by applying the additional pattern to the LDPC codeword comprises:

permuting the groups according to the additional pattern; and sequentially transmitting either information bits and parity bits or the parity bits at the associated coding rate after permuting the groups.

23. The method of claim 21, wherein when the associated coding rate is 1/3, M is 16, and N is 24, the additional pattern (PS2) is defined by parity group indices 1, 3, 5, 7, 9, 11, 13, 15, 2, 4, 6, 8, 10, 12, 14, 16.

24. The method of claim 21, wherein when the associated coding rate is 1/5, M is 16, and N is 20, the puncturing pattern (PS1) is defined by parity group indices 1, 3, 5, 7, 9, 11, 13, 15, 2, 4, 6, 8, 10, 12, 14, 16.

25. An apparatus for transmitting a signal in a communication system using a low density parity check (LDPC) code, the apparatus comprising:

an LDPC encoder for generating an LDPC codeword by encoding at a coding rate an information word;

a controller for generating a puncturing pattern when a hybrid automatic repeat request (HARQ) scheme to be applied to the LDPC codeword is an incremental redundancy (IR) scheme, generating an additional pattern when the HARQ scheme to be applied to the LDPC codeword is a partial chase combining (CC) scheme, and controlling an operation for transmitting a signal by applying the puncturing pattern to the LDPC codeword at an associated coding rate when the HARQ scheme to be used is the IR scheme and an operation for transmitting a signal by applying the additional pattern to the LDPC codeword at an associated coding rate when the HARQ scheme to be used is the partial CC scheme;

a transmission bit decision unit for deciding bits to be transmitted in the LDPC codeword under control of the controller; and a transmission processor for transmitting the bits decided by the transmission bit decision unit, wherein when the LDPC code is a block-LDPC (B-LDPC) code, a size of a base matrix is M×N, sizes of a permutation matrix and a zero matrix are L×L, a size of a parity check matrix is LM×LN, and a B-LDPC codeword comprises L(N−M) information bits and LM parity bits, the controller generates a total of M groups by grouping parity bits included in the B-LDPC codeword in a unit of L bits, sets to 1 an element value of the puncturing pattern to be applied to a first group of the M groups, and generates the puncturing pattern such that a message to be transferred from a check node of the B-LDPC codeword to an information node has a uniform value when the M groups are permuted in relation to an element value of the puncturing pattern to be applied to (M−1) parity groups excluding the first parity group of the M groups.

26. The apparatus of claim 25, wherein the controller generates the puncturing pattern such that a message to be transferred from a check node of the LDPC codeword to an information node has a uniform value when multiple groups generated by grouping parity bits in a unit of a preset number of bits are permuted.

27. The apparatus of claim 26, wherein the controller controls the transmission bit decision unit to decide the bits to be transmitted such that either information bits and parity bits or the parity bits are sequentially transmitted at the associated coding rate after permuting the multiple groups according to the puncturing pattern.

28. The apparatus of claim 25, wherein the controller controls an operation for sequentially transmitting either information bits and parity bits or the parity bits at the associated coding rate after permuting the groups according to the puncturing pattern.

29. The apparatus of claim 25, wherein when the associated coding rate is ⅓, M is 16, and N is 24, the puncturing pattern (PS1) is defined by parity group indices 1, 9, 5, 13, 3, 7, 11, 15, 2, 10, 6, 14, 4, 12, 8, 16.

30. The apparatus of claim 25, wherein when the associated coding rate is ⅕, M is 16, and N is 20, the puncturing pattern (PS1) is defined by parity group indices 1, 9, 5, 13, 3, 7, 11, 15, 2, 10, 6, 14, 4, 12, 8, 16.

31. The apparatus of claim 25, wherein when the LDPC code is a block-LDPC (B-LDPC) code, a size of a base matrix is M×N, sizes of a permutation matrix and a zero matrix are L×L, a size of a parity check matrix is LM×LN, and a B-LDPC codeword comprises L(N−M) information bits and LM parity bits, the controller generates a total of M groups by grouping parity bits comprised in the B-LDPC codeword in a unit of L bits, sets to 1 an element value of the additional pattern to be applied to a first group of the M groups, and generates the additional pattern such that a message to be transferred from a check node of the B-LDPC codeword to an information node has a uniform value when the M groups are permuted in relation to an element value of the additional pattern to be applied to (M−1) parity groups excluding the first parity group of the M groups.

32. The apparatus of claim 31, wherein the controller controls an operation for sequentially transmitting either information bits and parity bits or the parity bits at the associated coding rate after permuting the groups according to the additional pattern.

33. The apparatus of claim 31, wherein when the associated coding rate is ⅓, M is 16, and N is 24, the additional pattern (PS2) is defined by parity group indices 1, 3, 5, 7, 9, 11, 13, 15, 2, 4, 6, 8, 10, 12, 14, 16.

34. The apparatus of claim 31, wherein when the associated coding rate is ⅕, M is 16, and N is 20, the puncturing pattern (PS1) is defined by parity group indices 1, 3, 5, 7, 9, 11, 13, 15, 2, 4, 6, 8, 10, 12, 14, 16.

35. An apparatus for transmitting a signal in a communication system using a low density parity check (LDPC) code, the apparatus comprising:

an LDPC encoder for generating an LDPC codeword by encoding at a coding rate an information word;

a controller for generating a puncturing pattern when a hybrid automatic repeat request (HARQ) scheme to be applied to the LDPC codeword is an incremental redundancy (IR) scheme, generating an additional pattern when the HARQ scheme to be applied to the LDPC codeword is a partial chase combining (CC) scheme, and controlling an operation for transmitting a signal by applying the puncturing pattern to the LDPC codeword at an associated coding rate when the HARQ scheme to be used is the IR scheme and an operation for transmitting a signal by applying the additional pattern to the LDPC codeword at an associated coding rate when the HARQ scheme to be used is the partial CC scheme;

a transmission bit decision unit for deciding bits to be transmitted in the LDPC codeword under control of the controller; and a transmission processor for transmitting the bits decided by the transmission bit decision unit, wherein when the LDPC code is a block-LDPC (B-LDPC) code, a size of a base matrix is M×N, sizes of a permutation matrix and a zero matrix are L×L, a size of a parity check matrix is LM×LN, and a B-LDPC codeword comprises L(N−M) information bits and LM parity bits, the controller generates a total of M groups by grouping parity bits comprised in the B-LDPC codeword in a unit of L bits, sets to 1 an element value of the puncturing pattern to be applied to a first group of the M groups, and generates the puncturing pattern such that parity bits before the B-LDPC codeword is punctured are arranged at regular distances when the M groups are permuted in relation to an element value of the puncturing pattern to be applied to (M−1) parity groups excluding the first parity group of the M groups.

36. The apparatus of claim 35, wherein the controller generates the puncturing pattern such that parity bits are arranged at regular distances before the LDPC codeword is punctured when multiple groups generated by grouping parity bits in a unit of a preset number of bits are permuted.

37. The apparatus of claim 36, wherein the controller controls the transmission bit decision unit to decide the bits to be transmitted such that either information bits and parity bits or the parity bits are sequentially transmitted at the associated coding rate after permuting the multiple groups according to the puncturing pattern.

38. The apparatus of claim 35, wherein the controller generates the additional pattern such that a message to be transferred from a check node of the LDPC codeword to an information node has a uniform value when multiple groups generated by grouping parity bits in a unit of a preset number of bits are permuted.

39. The apparatus of claim 38, wherein the controller controls the transmission bit decision unit to decide the bits to be transmitted such that either information bits and parity bits or the parity bits are sequentially transmitted at the associated coding rate after permuting the multiple groups according to the additional pattern.

40. The apparatus of claim 35, wherein the controller generates the additional pattern such that additional parity bits to be transmitted are alternately arranged when multiple groups generated by grouping parity bits in a unit of a preset number of bits are permuted, and the additional parity bits are arranged in empty positions from a beginning when they are no longer alternately arranged.

41. The apparatus of claim 40, wherein the controller controls an operation for sequentially transmitting either information bits and parity bits or the parity bits at the associated coding rate in the transmission bit decision unit after permuting the multiple groups according to the additional pattern.

42. The apparatus of claim 25, wherein the controller controls an operation for sequentially transmitting either information bits and parity bits or the parity bits at the associated coding rate after permuting the groups according to the puncturing pattern.

43. The apparatus of claim 25, wherein when the associated coding rate is 1/3, M is 16, and N is 24, the puncturing pattern (PS1) is defined by parity group indices 1, 9, 5, 13, 3, 7, 11, 15, 2, 10, 6, 14, 4, 12, 8, 16.

44. The apparatus of claim 35, wherein when the associated coding rate is 1/5, M is 16, and N is 20, the puncturing pattern (PS1) is defined by parity group indices 1, 9, 5, 13, 3, 7, 11, 15, 2, 10, 6, 14, 4, 12, 8, 16.

45. The apparatus of claim 35, wherein when the LDPC code is a block-LDPC (B-LDPC) code, a size of a base matrix is M×N, sizes of a permutation matrix and a zero matrix are L×L, a size of a parity check matrix is LM×LN, and a B-LDPC codeword comprises L(N−M) information bits and LM parity bits, the controller generates a total of M groups by grouping parity bits comprised in the B-LDPC codeword in a unit of L bits, sets to 1 an element value of the puncturing pattern to be applied to a first group of the M groups, to 1, and generates the additional pattern such that additional parity bits to be transmitted are alternately arranged when the M groups are permuted in relation to an element value of the puncturing pattern to be applied to (M−1) parity groups excluding the first parity group of the M groups, and the additional parity bits are arranged in empty positions from a beginning when they are no longer alternately arranged.

46. The apparatus of claim 45, wherein the controller controls the transmission bit decision unit to decide the bits to be transmitted such that either information bits and parity bits or the parity bits are sequentially transmitted at the associated coding rate after permuting the groups according to the additional pattern.

47. The apparatus of claim 45, wherein when the associated coding rate is 1/3, M is 16, and N is 24, the additional pattern (PS2) is defined by parity group indices 1, 3, 5, 7, 9, 11, 13, 15, 2, 4, 6, 8, 10, 12, 14, 16.

48. The apparatus of claim 45, wherein when the associated coding rate is 1/5, M is 16, and N is 20, the puncturing pattern (PS1) is defined by parity group indices 1, 3, 5, 7, 9, 11, 13, 15, 2, 4, 6, 8, 10, 12, 14, 16.

* * * * *